US009331301B2

(12) United States Patent
Ma et al.

(10) Patent No.: US 9,331,301 B2
(45) Date of Patent: May 3, 2016

(54) ACTIVE MATRIX ORGANIC LIGHT-EMITTING DISPLAY AND DISPLAY APPARATUS

(71) Applicant: BOE Technology Group Co., Ltd., Beijing (CN)

(72) Inventors: Zhanjie Ma, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/050,756

(22) Filed: Oct. 10, 2013

(65) Prior Publication Data

US 2014/0103313 A1 Apr. 17, 2014

(30) Foreign Application Priority Data

Oct. 12, 2012 (CN) .......................... 2012 1 0387817

(51) Int. Cl.
 H01L 29/08 (2006.01)
 H01L 51/52 (2006.01)
 H01L 27/32 (2006.01)

(52) U.S. Cl.
 CPC ............ H01L 51/52 (2013.01); H01L 27/3288 (2013.01)

(58) Field of Classification Search
 None
 See application file for complete search history.

(56) References Cited

U.S. PATENT DOCUMENTS

| 2003/0111954 | A1* | 6/2003 | Koo et al. | 313/498 |
| 2005/0258771 | A1 | 11/2005 | Kang et al. | |
| 2010/0171105 | A1* | 7/2010 | Kim et al. | 257/40 |

FOREIGN PATENT DOCUMENTS

| CN | 1430287 A | 7/2003 |
| CN | 1700816 A | 11/2005 |
| CN | 101783359 A | 7/2010 |
| CN | 202816949 U | 3/2013 |

OTHER PUBLICATIONS

First Office Action issued by the Chinese Patent Office for Chinese Patent Application No. 201210387817.X dated Jul. 28, 2014, 8pgs.
English translation of First Office Action issued by the Chinese Patent Office for Chinese Patent Application No. 201210387817.X dated Jul. 28, 2014, 6pgs.
English abstract of CN101783359A, listed above, 2 pages.
Second Office Action (Chinese language) issued by the State Intellectual Property Office ("SIPO") on Dec. 2, 2014 for International Application No. 201210387817.X, 8 pages.
English translation of second Office Action (listed above) issued by SIPO for International Application No. 201210387817.X, 7 pages.

* cited by examiner

*Primary Examiner* — Daniel Whalen
(74) *Attorney, Agent, or Firm* — Ladas & Parry LLP

(57) ABSTRACT

An AMOLED comprises a plurality of pixel structures arranged in a matrix and one layer of power supply signal electrode configured to provide a power supply voltage signal for the pixel structures, and the power supply signal electrode has a planar structure. The planar power supply signal electrode can greatly reduce its resistance and hence can reduce the IR drop of power supply voltage signals that are transmitted over the power supply signal electrode, effectively reduce the impact of the IR drop on the display effect, and remarkably reduce the power consumption of a panel.

4 Claims, 8 Drawing Sheets

ACTIVE MATRIX ORGANIC LIGHT-EMITTING DISPLAY AND DISPLAY APPARATUS

CROSS REFERENCE TO RELATED APPLICATIONS

This application claims priority from Chinese National Application No. 201210387817.X filed on Oct. 12, 2012, the contents of which are incorporated herein by reference.

BACKGROUND

Embodiments of the present disclosure relate to an organic light-emitting display (OLED) and a display apparatus.

An organic light-emitting display (OLED) is a display in which organic semiconductor luminescent materials are driven by an electric field to emit light through carrier injection and recombination. The luminescent mechanism of an OLED is as follows: an indium tin oxide (ITO) transparent electrode and a metal electrode are employed as an anode and a cathode of the display; and electrons and holes are driven under a certain voltage to be injected into an electron transport layer and a hole transport layer from the anode and the cathode, migrated from the electron transport layer and the hole transport layer to an light emitting layer, and meet each other in the light emitting layer to form excitons which are hence excited to emit visible light through radiative relaxation. The OLED has the advantages of thinner thickness and lighter weight, initiative luminescence (no backlight required), wide viewing angle, high resolution, high brightness, fast response, low power consumption, wide range of service temperature, excellent shock resistance, low cost, capability of achieving flexible display, and the like.

There are two types of OLEDs in the light of the driving mode: passive driving mode and active driving mode, i.e., direct addressing mode and thin-film transistor (TFT) matrix addressing mode. The active driving mode refers to that each light-emitting element in an active matrix (AM) is independently controlled through TFT addressing. A pixel structure comprising the light-emitting element and a thin film transistor (TFT) addressing circuit is loaded with direct-current supply voltage signals (VDD) from a power supply signal line for driving.

The wiring mode of the power supply signal lines in a current AMOLED panel is, as illustrated in FIG. 1, as follows: in general, power supply signal lines corresponding to pixel structures one by one are disposed among each column of pixel structures; a closed peripheral power supply signal line circle is disposed outside and around the display area of the panel; and direct-current supply voltage signals (VDD) from a signal source IC are respectively transmitted to the pixel structures connected therewith through the power supply signal lines.

Another wiring mode of the power supply signal lines is illustrated in FIG. 2. Compared with the wiring mode as illustrated in FIG. 1, in the wiring mode as illustrated in FIG. 2, power supply signal lines are additionally disposed between any two adjacent rows of pixel structures; and the additionally provided transverse wiring power supply signal lines and the longitudinal power supply signal lines are cross-connected with each other to form a netted structure, which is further integrally connected with the peripheral power supply signal line circle disposed outside the display area. This wiring mode can effectively reduce the IR drop of the direct-current supply voltage signals transmitted over the power supply signal lines, and hence reduce the power consumption of the AMOLED panel and alleviate the impact of the IR drop on the display effect.

Although the above wiring mode of the power supply signal lines can effectively reduce the impact of the IR drop of the power supply signal lines on the display effect and reduce the power consumption of the panel when applied to a small-size AMOLED, along with the increased size of the AMOLED, the above wiring mode of the power supply signal lines cannot effectively solve the problems of the impact of the IR drop on the display effect and the power consumption of the panel.

SUMMARY

Embodiments of the present disclosure provide an AMOLED and a display apparatus, capable of effectively reducing the impact of the IR drop of power supply signal lines on the display effect and the power consumption of a panel.

In one aspect, the present disclosure provides an AMOLED, which comprises a plurality of pixel structures arranged in a matrix and one layer of power supply signal electrode configured to provide a power supply voltage signal for the pixel structures, and the power supply signal electrode has a planar structure.

In another aspect, the present disclosure provides a display apparatus, which comprises the AMOLED provided by the embodiment of the present disclosure.

In the AMOLED and the display apparatus provided by the embodiments of the present disclosure, the planar power supply signal electrode can greatly reduce its resistance thereof and hence reduce the IR drop of the power supply voltage signals that are transmitted over the power supply signal electrode, effectively reduce the impact of the IR drop on the display effect, and remarkably reduce the power consumption of the panel.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

The preferred embodiments of the AMOLED and the display apparatus provided by the present disclosure are described in detail below with reference to the accompanying drawings. The thickness of the various films and the size of the various areas in the accompanying drawings are not drawn in actual scale but are only intended to illustrate the embodiments of the present disclosure.

Figure 1:
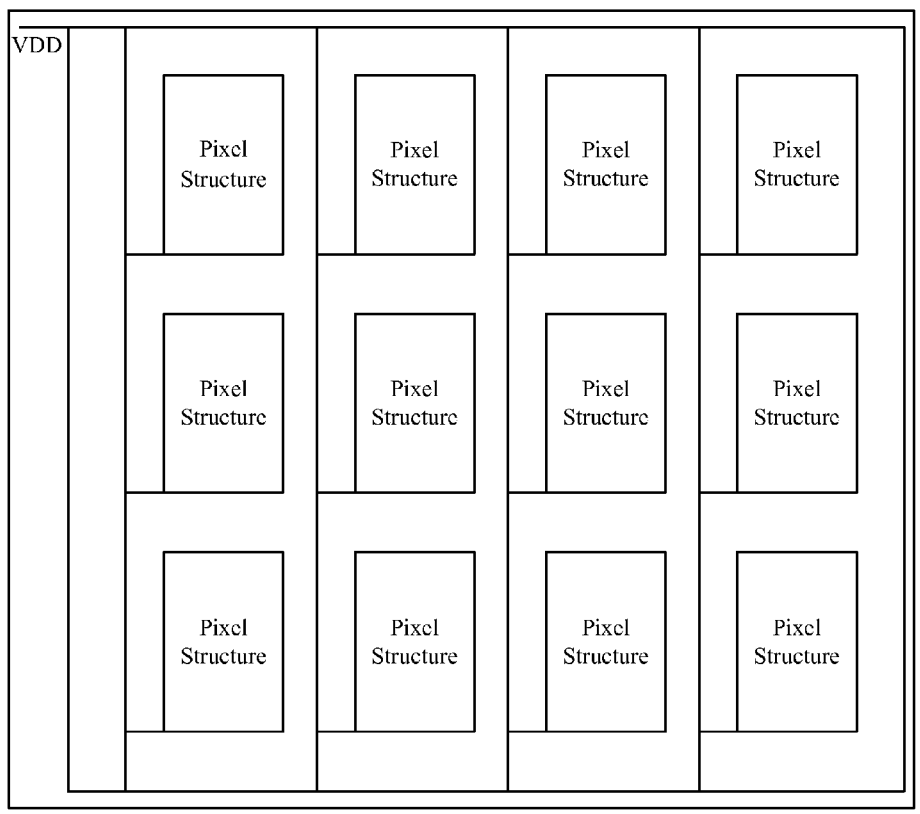
FIG. 1 is a first schematic structural wiring diagram of the power supply signal lines in a traditional AMOLED.
Figure 2:
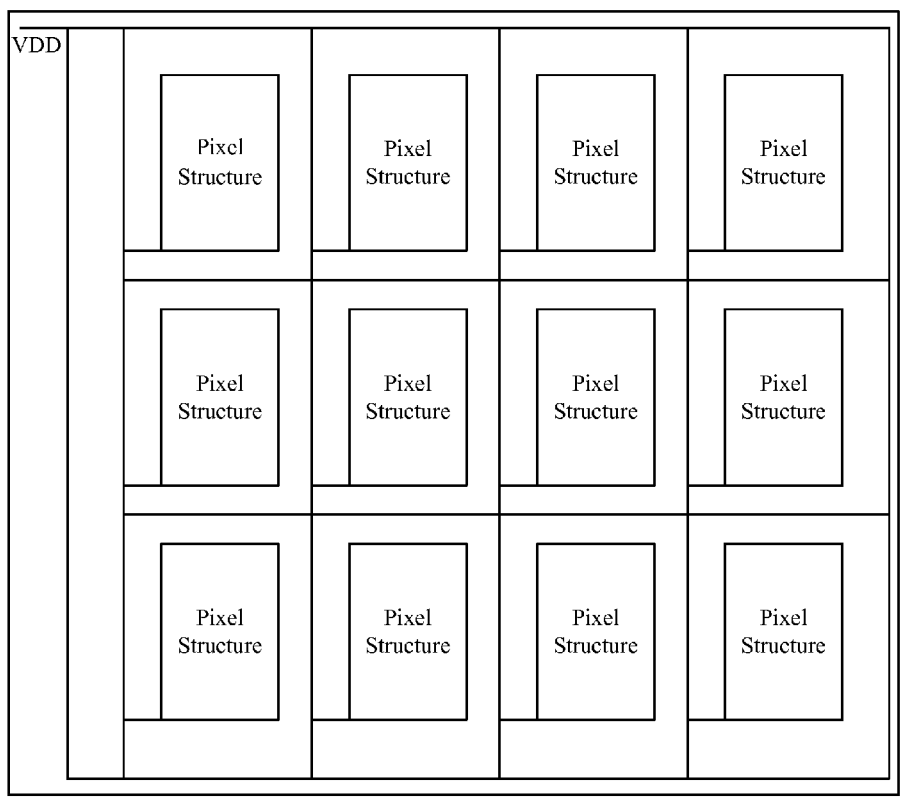
FIG. 2 is a second schematic structural wiring diagram of the power supply signal lines in a traditional AMOLED.
Figure 3:
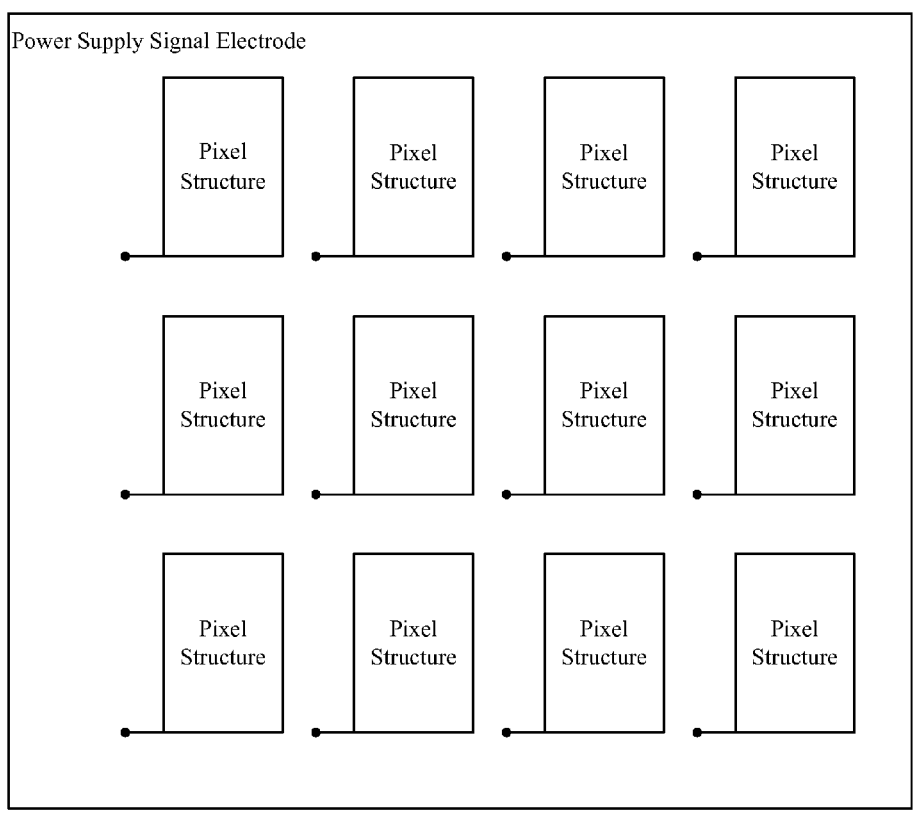
FIG. 3 is a schematic structural view of an AMOLED panel having a power supply signal electrode, provided by an embodiment of the present disclosure.

The AMOLED provided by an embodiment of the present disclosure, as illustrated in FIG. 3, comprises a plurality of pixel structures arranged in a matrix and further comprises one layer of power supply signal electrode configured to provide a power supply signal for the pixel structures, and the power supply signal electrode has a planar structure; each pixel structure is, for instance, a pixel for emitting red, green or blue light; and the planar power supply signal electrode covers two or more than two pixel structures at the same time, and even corresponds to all the pixel structures of the whole AMOLED.

In the AMOLED provided by the above embodiment of the present disclosure, the traditional linear power supply signal lines are modified (redesigned) and optimized, and converted into one layer of planar power supply signal electrode, by which a display area of the panel is covered in the whole plane for example. In comparison, the whole planar power supply signal electrode can greatly reduce the resistance thereof and hence reduce the IR drop of the power supply voltage signals that are transmitted over the power supply signal electrode, effectively reduce the impact of the IR drop on the display effect, and remarkably reduce the power consumption of the panel.

The typical structures of the pixel structure and the power supply signal electrode of the AMOLED are described in detail below.

Figure 4:
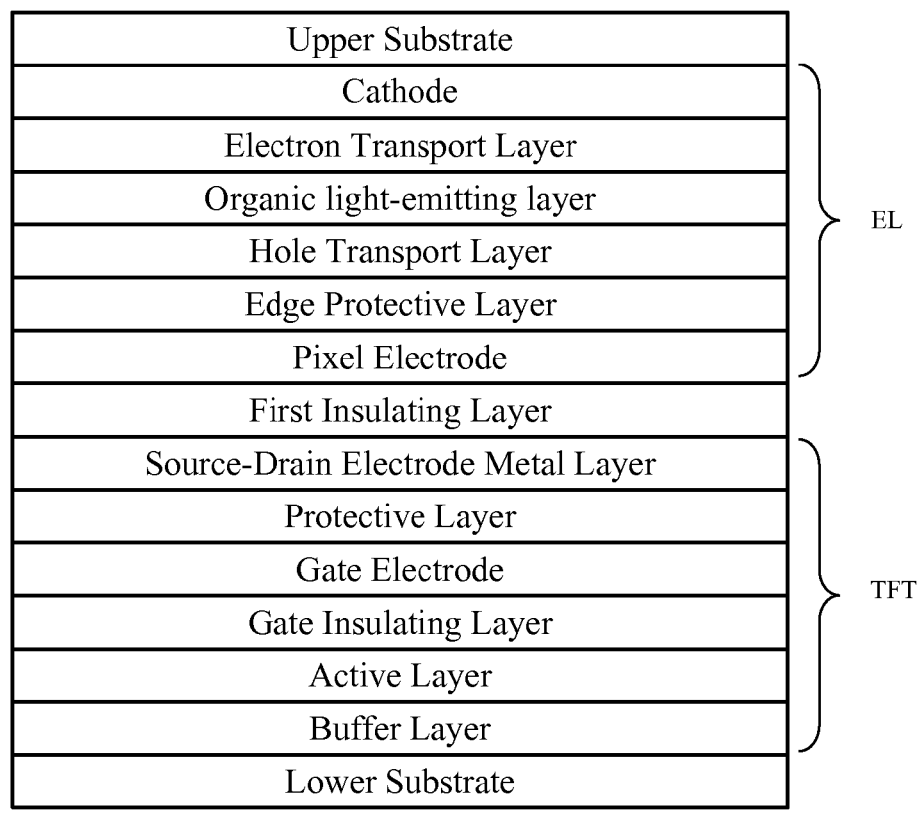
FIG. 4 is a schematic structural view of a pixel structure in the AMOLED provided by an embodiment of the present disclosure.

For instance, one pixel structure in the AMOLED generally comprises an upper substrate, a lower substrate, and a buffer layer, a thin film transistor (TFT) structure and an organic electroluminescent (EL) structure disposed on a lower substrate in order, as illustrated in FIG. 4, and the TFT structure is configured to drive the organic EL structure. The TFT structure, for instance, includes an active layer, a gate insulating layer, a gate electrode, a protective layer, source and drain electrodes, and a first insulating layer. In addition, the TFT structure may be in a traditional top-gate structure, a traditional bottom-gate structure, or the like, and any of the embodiments of the present disclosure will not be limited thereto.

The simplest organic EL structure includes an anode, an organic light-emitting layer and a cathode. In order to improve the luminous efficiency, one example of the organic EL structure may comprise an anode (e.g., a pixel electrode for a pixel structure), an edge protective layer, a hole transport layer, an organic light-emitting layer, an electron transport layer, and a cathode. Moreover, the organic EL structure may further comprise functional film layers such as an electron barrier layer and a hole barrier layer. These structural layers may be made of a material (or materials) known in the art and will not be described in detail herein for simplicity.

Figure 5A:
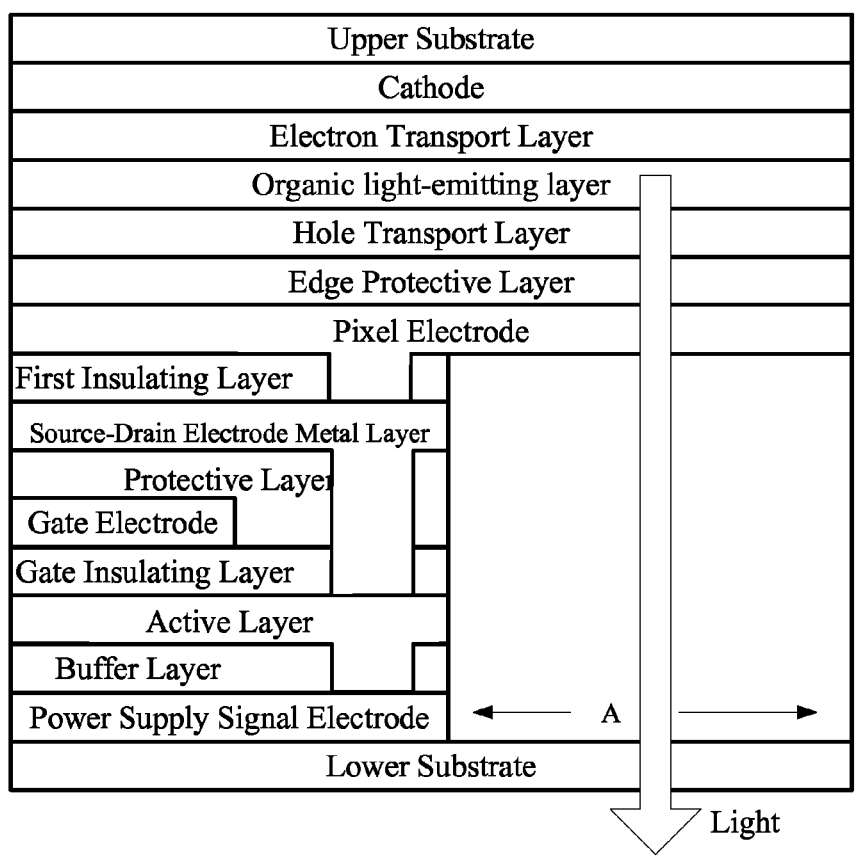
FIGS. 5a and 5b are schematic diagrams illustrating the position of the power supply signal electrode of the AMOLED provided by an embodiment of the present disclosure.

The traditional linear power supply signal lines are generally disposed on the same layer as the source/drain electrodes, namely the power supply signal lines and the source/drain electrodes are formed in one patterning process. In the AMOLED provided by the embodiment of the present disclosure, the power supply signal lines are redesigned into the planar power supply signal electrode. Moreover, in order to not affect the normal operation of the pixel structures, for instance, the power supply signal electrode may be arranged between the lower substrate and the buffer layer for forming each pixel structure, as illustrated in FIG. 5a, or may be arranged between the organic EL structure and the upper substrate, for instance, between the cathode and the upper substrate, and isolated from the cathode through a second insulating layer, as illustrated in FIG. 5b.

The AMOLED provided by the embodiment of the present disclosure may be of a top emission type AMOLED or a bottom emission type AMOLED. In order to reduce the resistance, the power supply signal electrode is usually made of a low-resistance metallic material, for instance, is made of an opaque metal. Therefore, in order to not affect the normal emission of each pixel structure, when the pixel structure is of the bottom emission type and the power supply signal electrode is disposed between the buffer layer and the lower substrate, as illustrated in FIG. 5a, a pattern in which the power supply signal electrode is removed (or not formed) in an area A of the power supply signal electrode (i.e., an opening in the planar structure) is formed, corresponding to a light-emitting window of each pixel structure, so that the light excited by the organic light-emitting layer can be normally emitted out through the light-emitting window.

Figure 5B:
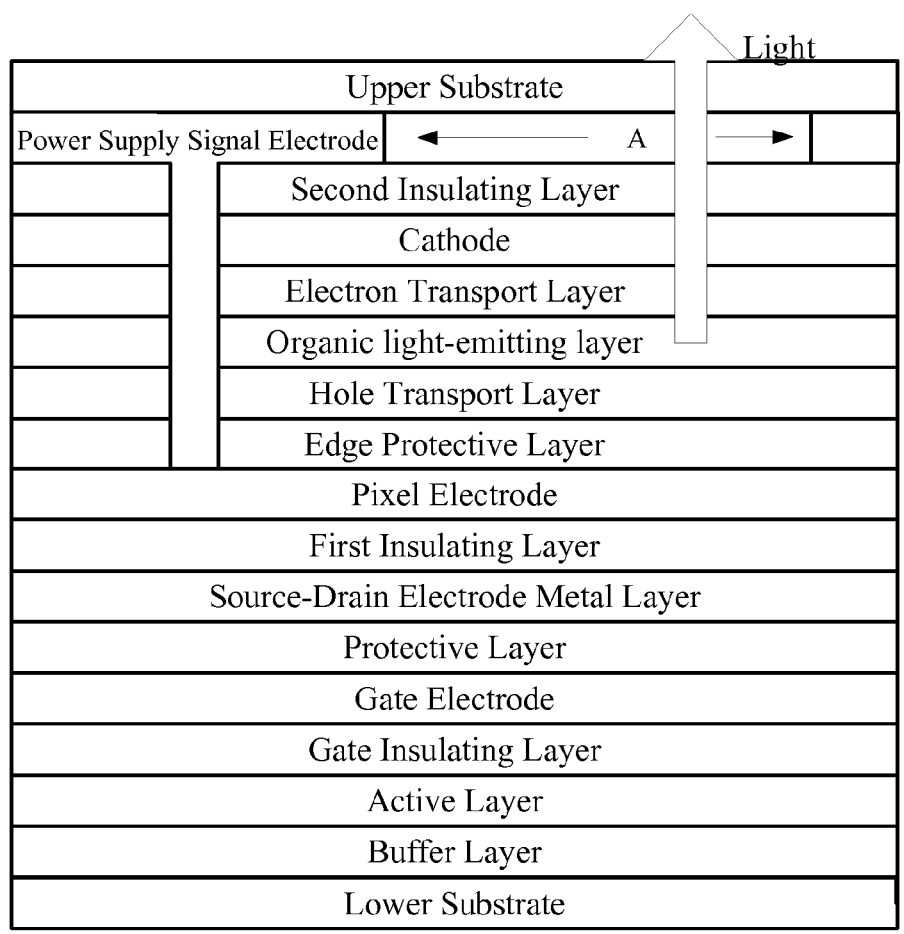

Similarly, when each pixel structure is of the top emission type and the power supply signal electrode is disposed between the cathode and the upper substrate, as illustrated in FIG. 5b, a pattern in which the power supply signal electrode is removed (or not formed) in the area A of the power supply signal electrode (i.e., the opening in the planar structure) is formed, corresponding to the light-emitting window of each pixel structure, so that the light excited by the organic light-emitting layer can be normally emitted through the light-emitting window.

As the power supply signal electrode is not arranged in all the film layers of the pixel structures, in order to realize that the power supply signal electrode can normally provide the power supply voltage signals for the pixel structures, for instance, the power supply signal electrode may be electrically connected with the active layer and one of the source/drain electrodes in the TFT structures, or with the pixel electrode in the organic EL structure via a through hole. For example, as illustrated in FIG. 5a, the power supply signal electrode is arranged between the lower substrate and the buffer layer and electrically connected with the active layer via a through hole; and as illustrated in FIG. 5b, the power supply signal electrode is disposed between the upper substrate and the cathode and electrically connected with the pixel electrode via a through hole. Please note FIGS. 5a and 5b only illustrate the connection relationships between the power supply signal electrode and various film layers in the pixel structures. The embodiments of the present disclosure are not limited thereto.

The preparation process of the AMOLED of the embodiment is described in detail below by taking the AMOLED structure as illustrated in FIG. 5a for example. An exemplary preparation process specifically comprises the following processes:

1. A metal layer is deposited on a lower substrate (e.g., a bare glass substrate), and a pattern of a power supply signal electrode is formed by one patterning process, and such a patterning processes may comprise exposure, development, etching of the metal layer and photoresist removal.

2. A buffer layer is deposited on the pattern of the power supply signal electrode, in which the buffer layer, for instance, may be made of SiNx/SiO2 two-layer structure; and a through hole is formed, via which the power supply signal electrode is connected with the active layer of the TFT structure to be formed, by one patterning process. Thus, power supply voltage signals can be transmitted to the active layer of the pixel structure over the power supply signal electrode via the through hole.

3. For instance, an amorphous silicon semiconductor layer is deposited on the buffer layer, and then a polysilicon (P-Si) is formed after the amorphous silicon of the amorphous silicon semiconductor layer is crystallized with a low-temperature polysilicon process, and the pattern of the active layer is formed by one patterning process.

4. A gate insulating (GI) layer is formed on the pattern of the active layer, in which the gate insulating layer, for instance, can be made of $SiO_2$/SiNx two-layer structure.

5. A gate electrode metal layer is deposited on the gate insulating layer, and the pattern of a gate electrode and a gate electrode signal line is formed by one patterning process;

6. An ion doping process is performed on areas of the active layer corresponding to the source/drain electrodes to be formed, with the formed gate electrode being used as a mask layer, and then an ion activating process is performed.

7. A protective layer (ILD) is formed on the pattern of the gate electrode and the gate electrode signal line, and a through hole is formed, via which the power supply signal electrode is respectively connected with the active layer and one of the source/drain electrodes to be formed, by one patterning process.

8. A source-drain electrode metal layer is formed on the protective layer, and the pattern of the source/drain electrodes and data signal line is formed by one patterning process.

9. A first insulating layers (e.g., $SiNx/SiO_2$) and a planarizing (PLN) layer are formed on the source-drain electrode metal layer, and the PLN layer can be formed of a resin material for example. Then, a hydrogenation process is performed to improve the crystallization characteristic of the active layer. A through hole is formed, via which another of the source/drain electrodes is connected with the pixel electrode to be formed, by one patterning process.

10. A pixel electrode layer (ITO) is formed (deposited) on the first insulating layer and the planarizing layer, and the pattern of the pixel electrode is formed by one patterning process.

11. An edge protective layer (PDL), a hole transport layer, an organic light-emitting layer, an electron transport layer and a cathode are formed on the patterns of the pixel electrodes in order; finally an upper substrate is bonded thereon, and the upper substrate may be a glass or plastic substrate.

Figure 6:
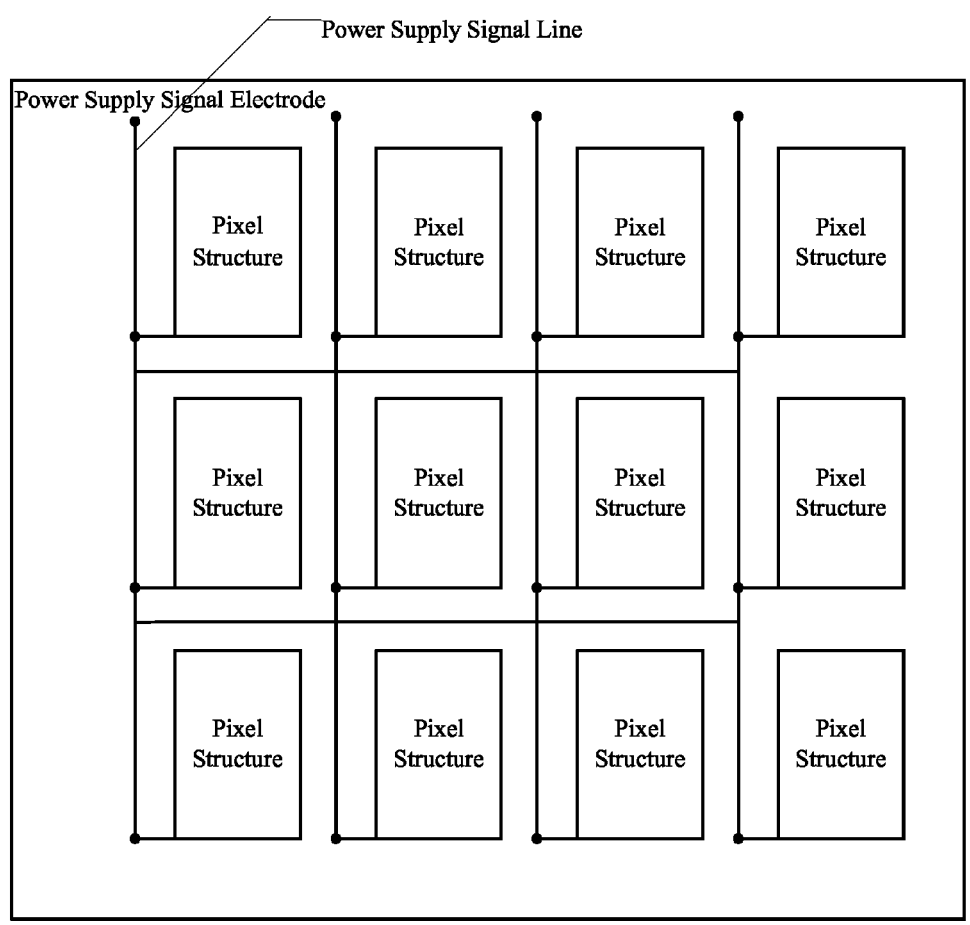
FIGS. 6 and 7 are schematic structural views of an AMOLED panel having a power supply signal electrode and electrode signal lines, provided by an embodiment of the present disclosure.

Moreover, in order to further reduce the resistance of the power supply signal electrode, in an AMOLED provided by another embodiment of the present disclosure, as illustrated in FIG. 6, the AMOLED further comprises power supply signal lines in addition to the planar power supply signal electrode. The power supply signal lines are connected in parallel with the power supply signal electrode, so that the resistance of the power supply signal electrode can be further reduced, and hence the IR drop during the transmission of power supply voltage signals can be reduced. For instance, the power supply signal lines are disposed on the same layer with source/drain electrodes in TFT structures of pixel structures. For example, the power supply signal lines may include power supply signal lines disposed between any two adjacent columns of pixel structures and corresponding to the pixel structures one by one, and a closed peripheral power supply signal line circle is disposed outside the display area of a panel. Or, power supply signal lines can be additionally disposed between any two adjacent rows of pixel structures, and the transverse wiring power supply signal lines and the longitudinal wiring power supply signal lines are cross-connected to form a netted structure.

Figure 7:
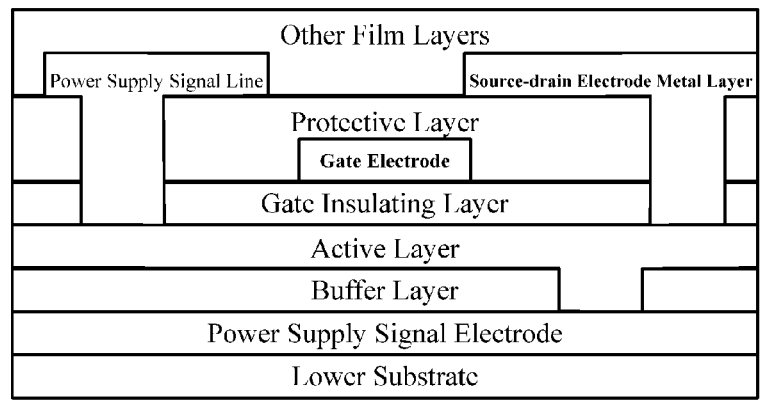

For example, the power supply signal lines can be electrically connected with the active layers of pixel structures via through holes, and moreover, the power supply signal electrode is electrically connected with the active layers via through holes, thus the power supply signal lines and the power supply signal electrode are combined to form a conduction structure in parallel, as illustrated in FIG. 7. Of course, the power supply signal lines and the power supply signal electrode can also be combined to form the conduction structure in parallel through another specific structure. The embodiments of the present disclosure are not limited thereto.

Figure 8:
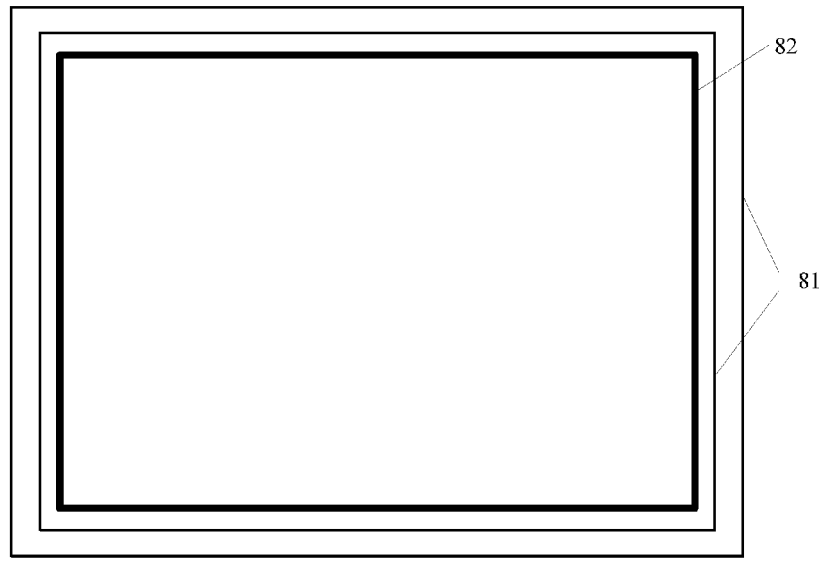
FIG. 8 is a schematic structural view of a low-level signal electrode in the AMOLED provided by an embodiment of the present disclosure.

Furthermore, the AMOLED provided by the embodiment of the present disclosure may further comprise at least one layer of low-level signal electrode (VSS) electrically connected with the cathodes in the organic EL emission layers, and each layer of the low-level signal electrode may also have a planar structure. As illustrated in FIG. 8, the low-level signal electrode layers 81 can be electrically connected together via a through hole (or through holes) 82, so that the resistance of the low-level signal electrodes can be further reduced, and therefore the power consumption of the VSS can be reduced.

Another embodiment of the present disclosure further provides a display apparatus, which comprises an AMOLED provided by any embodiment of the present disclosure. The display apparatus of the embodiment of the present disclosure further comprises other components or devices, such as driving circuits or signal processing circuits, and the AMOLED can be referred to the above disclosure.

In the AMOLED and the display apparatus provided by the embodiments of the present disclosure, the traditional linear power supply lines are modified and optimized and converted into one layer of planar power supply signal electrode in which the display area of the panel can be covered by the whole plane for example. Compared with the linear power supply signal lines in the traditional AMOLED, the planar power supply signal electrode can greatly reduce the resistance thereof, and hence reduce the IR drop of the power supply voltage signals that are transmitted over the power supply signal electrode, effectively reduce the impact of the IR drop on the display effect, and remarkably reduce the power consumption of the panel.

Obviously, various changes and modifications can be made to the present disclosure by those skilled in the art without departing from the spirit and scope of the present disclosure. Therefore, if the changes and modifications of the present disclosure fall within the scope of the appended claims of the present disclosure and equivalent techniques thereof, the present disclosure is also intended to include the changes and modifications.

What is claimed is:

1. An active matrix organic light-emitting display (AMOLED), comprising:
   a plurality of pixel structures arranged in a matrix, wherein each of the pixel structures comprises a thin-film transistor (TFT) structure and an organic electroluminescent (EL) structure, and the TFT structure comprises a source/drain electrode and an active layer and is configured to control the organic EL structure;

one layer of power supply signal electrode configured to provide a power supply voltage signal for the pixel structures and directly connected to the active layer of the TFT structure of each of the pixel structures via a first through hole, power supply signal lines extending between at least two pixel structures;

wherein the power supply signal electrode has a planar structure, and the power supply signal lines are disposed on the same layer as the source/drain electrode in the TFT structure of each of the pixel structures and directly connected to the active layer of the same TFT structure of each of the pixel structures via a second through hole as the power supply signal electrode is directly connected to, whereby the power supply signal lines are connected in parallel with the power supply signal electrode upon the TFT structure of each of the pixel structures being turned on.

2. The display according to claim 1, wherein each of the pixel structures comprises an upper substrate, a lower substrate and a buffer layer, the thin-film transistor (TFT) structure and the organic electroluminescent (EL) structure disposed on the lower substrate in order.

3. The display according to claim 2, wherein the power supply signal electrode is disposed between the buffer layer and the lower substrate.

4. A display apparatus, comprising the AMOLED according to claim 1.

* * * * *